(12) United States Patent
Yamashita

(10) Patent No.: US 11,075,611 B2
(45) Date of Patent: Jul. 27, 2021

(54) FREQUENCY ADJUSTMENT METHOD FOR PIEZOELECTRIC RESONATOR DEVICE

(71) Applicant: Daishinku Corporation, Kakogawa (JP)

(72) Inventor: Hiroaki Yamashita, Kakogawa (JP)

(73) Assignee: Daishinku Corporation, Kakogawa (JP)

( * ) Notice: Subject to any disclaimer, the term of this patent is extended or adjusted under 35 U.S.C. 154(b) by 172 days.

(21) Appl. No.: 16/343,398

(22) PCT Filed: Sep. 28, 2017

(86) PCT No.: PCT/JP2017/035310
§ 371 (c)(1),
(2) Date: Apr. 18, 2019

(87) PCT Pub. No.: WO2018/079181
PCT Pub. Date: May 3, 2018

(65) Prior Publication Data
US 2019/0253032 A1    Aug. 15, 2019

(30) Foreign Application Priority Data

Oct. 31, 2016  (JP) .............................. JP2016-213552

(51) Int. Cl.
*H03H 3/04*      (2006.01)
*H03H 3/02*      (2006.01)
*H03H 9/21*      (2006.01)

(52) U.S. Cl.
CPC ................ *H03H 3/04* (2013.01); *H03H 9/21* (2013.01); *H03H 2003/026* (2013.01);
(Continued)

(58) Field of Classification Search
CPC ...... H03H 3/04; H03H 9/21; H03H 2003/026; H03H 2003/0428; H03H 2003/0442;
(Continued)

(56) References Cited

U.S. PATENT DOCUMENTS 5,407,525 A * 4/1995 Michel ..................... H03H 3/04
                                                      156/345.24
7,521,846 B2 * 4/2009 Tanaya ............... G01C 19/5607
                                                          310/368

(Continued)

FOREIGN PATENT DOCUMENTS

JP        55154813 A  * 12/1980
JP       H11-195952 A    7/1999
(Continued)

*Primary Examiner* — Carl J Arbes
(74) *Attorney, Agent, or Firm* — Metrolex IP Law Group, PLLC

(57) ABSTRACT

An object is to provide a frequency adjustment method for a piezoelectric resonator device that is applicable to a microminiaturized device and that can adjust the frequency without deteriorating the accuracy of frequency adjustment. A frequency adjustment method for a tuning-fork quartz resonator is applicable to a tuning-fork quartz resonator that includes a tuning-fork quartz resonator piece having a pair of resonator arms 31, 32 and metallic adjustment films W formed on the resonator arms. The frequency adjustment method adjusts the frequency by reduction of a mass of the metallic adjustment films W. The frequency adjustment method includes: a rough adjustment step for roughly adjusting the frequency by partially thinning or removing the metallic adjustment films W; and a fine adjustment step for finely adjusting the frequency by at least partially thinning or removing products W1, W2 derived from the metallic adjustment film W during the rough adjustment step.

8 Claims, 6 Drawing Sheets

(52) U.S. Cl.
CPC ............ *H03H 2003/045* (2013.01); *H03H 2003/0428* (2013.01); *H03H 2003/0442* (2013.01); *H03H 2003/0457* (2013.01); *H03H 2003/0478* (2013.01); *H03H 2003/0492* (2013.01)

(58) Field of Classification Search
CPC ..... H03H 2003/045; H03H 2003/0457; H03H 2003/0478; H03H 2003/0492
See application file for complete search history.

(56) References Cited

U.S. PATENT DOCUMENTS

| | | | |
|---|---|---|---|
| 8,610,338 B2 * | 12/2013 | Ichikawa | H03H 9/19 310/370 |
| 2010/0201229 A1 * | 8/2010 | Saito | H03H 9/1021 310/370 |
| 2016/0260887 A1 | 9/2016 | Fujii et al. | |
| 2016/0294353 A1 | 10/2016 | Koga et al. | |
| 2017/0345995 A1 | 11/2017 | Nagahara et al. | |

FOREIGN PATENT DOCUMENTS

| | | | |
|---|---|---|---|
| JP | H11-346137 A | | 12/1999 |
| JP | 2000223984 A | * | 8/2000 |
| JP | 3330266 B | * | 9/2002 |
| JP | 2002319839 A | * | 10/2002 |
| JP | 2003-332871 A | * | 11/2003 |
| JP | 2003-332872 A | * | 11/2003 |
| JP | 2004-077453 A | | 3/2004 |
| JP | 3843716 B2 | * | 11/2006 |
| JP | 2009-232376 A | | 10/2009 |
| JP | 2013-183416 A | | 9/2013 |
| JP | 2015-095834 A | | 5/2015 |
| JP | 2015-103927 A | | 6/2015 |
| JP | 2015-103928 A | | 6/2015 |
| JP | 2015-103929 A | | 6/2015 |
| JP | 2016-092463 A | | 5/2016 |
| WO | WO 2016/136015 A1 | | 9/2016 |

* cited by examiner

FREQUENCY ADJUSTMENT METHOD FOR PIEZOELECTRIC RESONATOR DEVICE

TECHNICAL FIELD

The present invention relates to a frequency adjustment method for a piezoelectric resonator device employed in an electronic device or the like.

BACKGROUND ART

A tuning-fork crystal resonator is commonly used as a clock source for a watch, etc. For example, a tuning-fork crystal resonator is composed of an open-topped box-like container (not shown), a tuning-fork crystal resonator piece 7 (hereinafter simply called "resonator piece 7") having a tuning-fork shape as shown in FIG. 8 and bonded inside the container via a bonding material, and a flat plate-like lid (not shown) that hermetically seals the open top.

The resonator piece 7 has a base 8, a pair of resonator arms 9, 9 extending in the same direction from an end of the base, metallic adjustment films 10 for frequency adjustment provided on first main surfaces at the extreme ends of the pair of resonator arms 9, 9. Specifically, the metallic adjustment films 10 are formed on routing electrodes 11 that are formed on the first main surfaces at the extreme ends of the pair of resonator arms 9, 9. The routing electrodes 11 are configured to electrically connect drive electrodes that are formed on inner and outer side surfaces of the respective resonator arms 9 (the routing electrodes 11 are formed entirely around the extreme ends of the resonator arms). In FIG. 8, the routing electrodes 11 are shown only partially.

The process steps for producing this tuning-fork crystal resonator include a frequency adjustment step, which is described with reference to FIG. 8 and FIG. 9. In order to bring the frequency of the resonator piece to a prescribed target frequency range, In the frequency adjustment step, the mass of the metallic adjustment films 10, 10 formed on the first main surfaces at the extreme ends of the resonator arms 9, 9 is reduced by irradiation of a laser beam, etc. to the metallic adjustment films 10, 10. Specifically, the frequency adjustment step includes a rough adjustment step for rough frequency adjustment and a fine adjustment step for fine frequency adjustment. For convenience, the constitutive elements such as the resonator arms 9 are rotated by 90 degrees in FIG. 9.

The oscillation frequency of the resonator piece 7 gets higher as the mass of the metallic adjustment films 10 is reduced. However, even within the metallic adjustment films 10, the reduction of the mass causes different levels of frequency change (frequency adjustment sensitivity) at the extreme ends of the resonator arms 9 and at the portions apart from the extreme ends toward the basal ends of the resonator arms 9. Namely, the resonator arms 9 are more sensitive at the extreme ends than at the basal ends (when the same amount of mass is reduced, the extreme ends show a greater level of frequency change than the portions apart from the extreme ends). For this reason, the frequency adjustment is carried out in two steps, with dividing the metallic adjustment films 10 into rough adjustment areas 10*a* and fine adjustment areas 10*b*, as shown in FIG. 8 and FIG. 9. In the first step, the frequency is roughly adjusted in the rough adjustment areas 10*a* at the extreme ends of the resonator arms 9. In the second step, the frequency is finely adjusted in the fine adjustment areas 10*b* located closer to the basal ends of the resonator arms 9. The metallic adjustment films having this configuration are disclosed, for example, in PTL 1.

PRIOR ART DOCUMENT

Patent Document

Patent Document 1: JP H11-195952 A

SUMMARY OF INVENTION

Problem to Be Solved by the Invention

A conventional example of reducing the metallic adjustment films 10 by a laser beam (laser trimming) is described with reference to FIG. 9. To start with, a laser beam is emitted to the rough adjustment areas 10*a*, from above the first main surfaces of the resonator arms. At the same time, a laser beam is emitted in a direction parallel to the arm-width direction of the resonator arms 9 (a direction orthogonal to the extending direction of the resonator arms 9, shown by allows in FIG. 8). The laser beam is kept emitted to the metallic adjustment films 10, from the extreme ends toward the basal ends of the resonator arms 9, until the frequency reaches the target frequency range in the rough adjustment step. After the completion of the rough adjustment, the metallic films in the rough adjustment areas 10*a* may be not removed entirely but remain partially. Similarly, after the completion of the fine adjustment, the fine adjustment areas 10*b* may remain partially.

Recent microminiaturization of the tuning-fork crystal resonator has also decreased the area for the metallic adjustment films 10. For the conventional frequency adjustment method described above, it is more and more difficult to keep a sufficient adjustment area (amount of adjustment). In order to ensure the amount of adjustment, it is necessary to make the metallic adjustment films 10 thicker and thereby to increase the mass of the metallic films. Nevertheless, the thicker metallic adjustment films 10 entail the following problem.

As mentioned above, the frequency adjustment step starts with the rough adjustment step. As illustrated in FIG. 9, the first laser beam emitted to the extreme ends of the resonator arms 9 passes through the resonator arms 9 and reaches the extreme ends of the rough adjustment areas 10*a* (the extreme ends of the resonator arms 9). The molten and sublimed metal spreads radially under the main surfaces of the resonator arms 9 equipped with the metallic adjustment films 10, and eventually forms products 12 derived from the metallic adjustment films 10 (hereinafter simply called "products"). The products 12 attach to the main surfaces of the resonator arms 9 equipped with the metallic adjustment films 10, around the path of the laser beam.

The next laser beam is emitted to the resonator arms 9, with its irradiation positions shifting at a predetermined pitch toward the basal ends of the resonator arms 9. The predetermined pitch is so small that new products 12 formed by the next irradiation are likely to attach to the products 12 formed by the first irradiation. Laser beam irradiation continues with the irradiation positions shifting at a predetermined pitch toward the basal ends of the resonator arms 9, until the frequency reaches the target frequency range in the rough adjustment. As a result, the products 12 are deposited in portions of the rough adjustment areas 10*a* closer to the extreme ends of the resonator arms 9, as shown in FIG. 10. Additionally, in portions of the rough adjustment areas 10*a* closer to the basal ends of the resonator arms 9, the products 12 deposited by a preceding laser beam irradiation is partially removed by subsequent laser beam irradiations, but the products 12 around the final irradiation positions are not removed completely but are kept attached.

In an ultrasonic washing step after the frequency adjustment step, such products 12 may fall off from the resonator piece, causing a notable change in frequency. Besides, an increase in thickness of the metallic adjustment films 10 increases the mass of the metal to be removed by laser beam irradiation, which makes fine adjustment (small-amount removal) difficult. For these reasons, the thick metallic adjustment films disadvantageously deteriorate the accuracy of frequency adjustment.

As an alternative, the metallic adjustment films 10 may not be made thicker at the start. This alternative method utilizes the metallic adjustment films 10 having a normal thickness, and includes the steps of subjecting the metallic adjustment films 10 to laser trimming, forming metallic films again (making the films thicker), and irradiating the thickened metallic adjustment films with a laser beam to reduce its mass. However, the additional film forming step deteriorates the production efficiency. Besides, an increase in thickness of the metallic films increases the mass of the metal to be removed by laser beam irradiation, which makes fine adjustment (small-amount removal) difficult.

The present invention is made in view of these conventional problems, and intends to provide a frequency adjustment method for a piezoelectric resonator device that is applicable to a microminiaturized device and that can adjust the frequency without deteriorating the accuracy of frequency adjustment.

Means for Solving the Problem

The present invention constitutes the means for solving the above-mentioned problems in the following manner. The present invention provides a frequency adjustment method for a piezoelectric resonator device, wherein the piezoelectric resonator device includes a tuning-fork piezoelectric resonator piece having a pair of resonator arms and a metallic adjustment film formed on each of the resonator arms, and wherein a frequency is adjusted by reduction of a mass of the metallic adjustment film. The frequency adjustment method includes: a rough adjustment step for roughly adjusting the frequency by partially thinning or removing the metallic adjustment film; and a fine adjustment step for finely adjusting the frequency by at least partially thinning or removing a product derived from the metallic adjustment film that has been thinned or removed in the rough adjustment step.

The present invention as described above can improve the accuracy of frequency adjustment in a microminiaturized tuning-fork piezoelectric resonator piece. This is because the products derived from the metallic adjustment films that have been thinned or removed in the rough adjustment step are at least partially thinned or removed in the fine adjustment step. Since the thinning or removal in the fine adjustment step is targeted at the products derived from the metallic adjustment films that have been thinned or removed in the rough adjustment step, this method can decrease the amount of products falling off from the tuning-fork piezoelectric resonator piece in a washing step after the frequency adjustment step. In this context, the term "product derived from the metallic adjustment film" refers to a deposit of metal particles that have melted and sublimed out of a metallic adjustment film.

In the fine adjustment step according to the present invention, the thinning or removal of the product derived from the metallic adjustment film starts at an edge of the product on an extreme end side of each resonator arm, and proceeds toward a basal end of each resonator arm.

The present invention as described above can efficiently accomplish the fine frequency adjustment because, in the areas of the products derived from the metallic adjustment films, the fine adjustment starts at the positions where the maximum amount of adjustment is expected. Namely, in the product attached areas, the edges of the products on the extreme end side of the resonator arms, which are most sensitive to frequency adjustment, are thinned or removed without fail. This process is suitable particularly when the fine adjustment step needs a relatively large amount of adjustment in order to bring the frequency to the target frequency range.

In the fine adjustment step according to the present invention, the thinning or removal of the product derived from the metallic adjustment film starts at a position that is apart from an edge of the product on an extreme end side of each resonator arm and that is displaced toward a basal end of each resonator arm, and the thinning or removal of the product proceeds toward the basal end of each resonator arm.

The present invention as described above can efficiently accomplish the fine frequency adjustment. In the product attached areas, the thinning or removal of the products starts at the positions apart from the edges of the product attached areas on the extreme end side of the resonator arms, such positions being relatively less sensitive to frequency adjustment than the product attached areas on the extreme end side of the resonator arms. In other words, the fine adjustment starts not at the edges of the product attached areas but at certain positions within the product attached areas, which enables efficient frequency adjustment in the case where the fine adjustment step needs a relatively small amount of adjustment in order to bring the frequency to the target frequency range.

According to the present invention, the fine adjustment in the fine adjustment step is not applied to a remaining area that has not been thinned or removed in the rough adjustment step for the metallic adjustment film.

The present invention as described above can improve the accuracy of frequency adjustment because areas of the metallic adjustment films not processed in the rough adjustment step are not irradiated with the laser beam in the fine adjustment step, either. In contrast, if remaining thick portions of the metallic adjustment films (portions not thinned or removed in the rough adjustment step) are irradiated with the laser beam, the influence of thickness is dominant over the sensitivity to frequency adjustment, and deteriorates the accuracy of frequency adjustment. The present invention can prevent this problem.

According to the present invention, the piezoelectric resonator device that accommodates the tuning-fork piezoelectric resonator piece has a generally rectangular shape in plan view, with plane external dimensions of the piezoelectric resonator device being 1.6 mm or less on long sides and 1.0 mm or less on short sides (hereinafter called "1.6 mm×1.0 mm piezoelectric resonator device"), and the metallic adjustment film has a thickness of 0.003 mm or more before the rough adjustment step. Alternatively, according to the present invention, the piezoelectric resonator device that accommodates the tuning-fork piezoelectric resonator piece has a generally rectangular shape in plan view, with plane external dimensions of the piezoelectric resonator device being 1.2 mm or less on long sides and 1.0 mm or less on short sides (hereinafter called "1.2 mm×1.0 mm piezoelectric resonator device"), and the metallic adjustment film has a thickness of 0.010 mm or more before the rough adjustment step.

In a microminiaturized piezoelectric resonator device having the above-mentioned external dimensions, the present invention as described above can improve the accuracy of frequency adjustment in the tuning-fork piezoelectric resonator piece having thick metallic adjustment films. In the present invention, a metallic adjustment film having a thickness of 0.003 mm or more for the 1.6 mm×1.0 mm piezoelectric resonator device (or a metallic adjustment film having a thickness of 0.010 mm or more for the 1.2 mm×1.0 mm piezoelectric resonator device) is defined as a thick film and thus distinguished from the one having a conventional thickness.

In the case where the 1.6 mm×1.0 mm piezoelectric resonator device has the metallic adjustment films in a thickness of 0.003 mm or less, the products are formed in a smaller amount than in the case where the metallic adjustment films have a thickness of 0.003 mm or more. This arrangement prevents the attached products from falling off from the resonator piece in a washing step and causing a serious change in frequency. However, the metallic adjustment films having a thickness of 0.003 mm or less may not be able to leave a sufficient amount of products to be processed in the fine adjustment (amount of fine adjustment) after the rough adjustment step. To compensate for the insufficiency, it is necessary to irradiate the remaining thick portions of the metallic adjustment films with the laser beam.

On the other hand, the metallic adjustment films having a thickness of 0.003 mm or more can form the products in a sufficient amount to be processed in the fine adjustment, and can ensure the amount of fine adjustment. Besides, the fine adjustment using such products can dispense with irradiation of the laser beam to the thick portions of the metallic adjustment films that have not been processed in the rough adjustment step. This process can prevent deterioration of the accuracy of frequency adjustment.

Similarly, in the case where the 1.2 mm×1.0 mm piezoelectric resonator device has the metallic adjustment films in a thickness of 0.010 mm or less, the products are formed in a smaller amount than in the case where the metallic adjustment films have a thickness of 0.010 mm or more. This arrangement prevents the attached products from falling off from the resonator piece in a washing step and causing a serious change in frequency. However, the metallic adjustment films having a thickness of 0.010 mm or less may not be able to leave a sufficient amount of products to be processed in the fine adjustment (amount of fine adjustment) after the rough adjustment step. To compensate for the insufficiency, it is necessary to irradiate the remaining thick portions of the metallic adjustment films with the laser beam.

On the other hand, the metallic adjustment films having a thickness of 0.010 mm or more can form the products in a sufficient amount to be processed in the fine adjustment, and can ensure the amount of fine adjustment. Besides, the fine adjustment using such products can dispense with irradiation of the laser beam to the thick portions of the metallic adjustment films that have not been processed in the rough adjustment step. This process can prevent deterioration of the accuracy of frequency adjustment.

Advantageous Effects of Invention

As described above, the present invention can provide a frequency adjustment method for a piezoelectric resonator device that is applicable to a microminiaturized device and that can adjust the frequency without deteriorating the accuracy of frequency adjustment.

MODE FOR CARRYING OUT THE INVENTION

Taking a tuning-fork crystal resonator as an example, an embodiment of the present invention is described mainly with regard to the frequency adjustment step. A tuning-fork crystal resonator (hereinafter simply called "crystal resonator") in this embodiment is a surface-mount crystal resonator having a substantially cuboid package. In this embodiment, the plane external dimensions of the crystal resonator are 1.6 mm on long sides and 1.0 mm on short sides. The plane external dimensions of the crystal resonator are not limited thereto, and may be smaller (e.g., 1.2 mm on long sides and 1.0 mm on short sides).

A crystal resonator 100 (see FIG. 2) is composed of a container 101 (see FIG. 2) having a recess and made of an insulating material, a tuning-fork crystal resonator piece (hereinafter simply called "resonator piece") bonded inside the container 101 via a bonding material such as a metal bump, and a lid bonded to the periphery of the recess via a sealing material so as to encapsulate the resonator piece hermetically. In this embodiment, the nominal frequency of the crystal resonator is 32.768 kHz.

Figure 1:
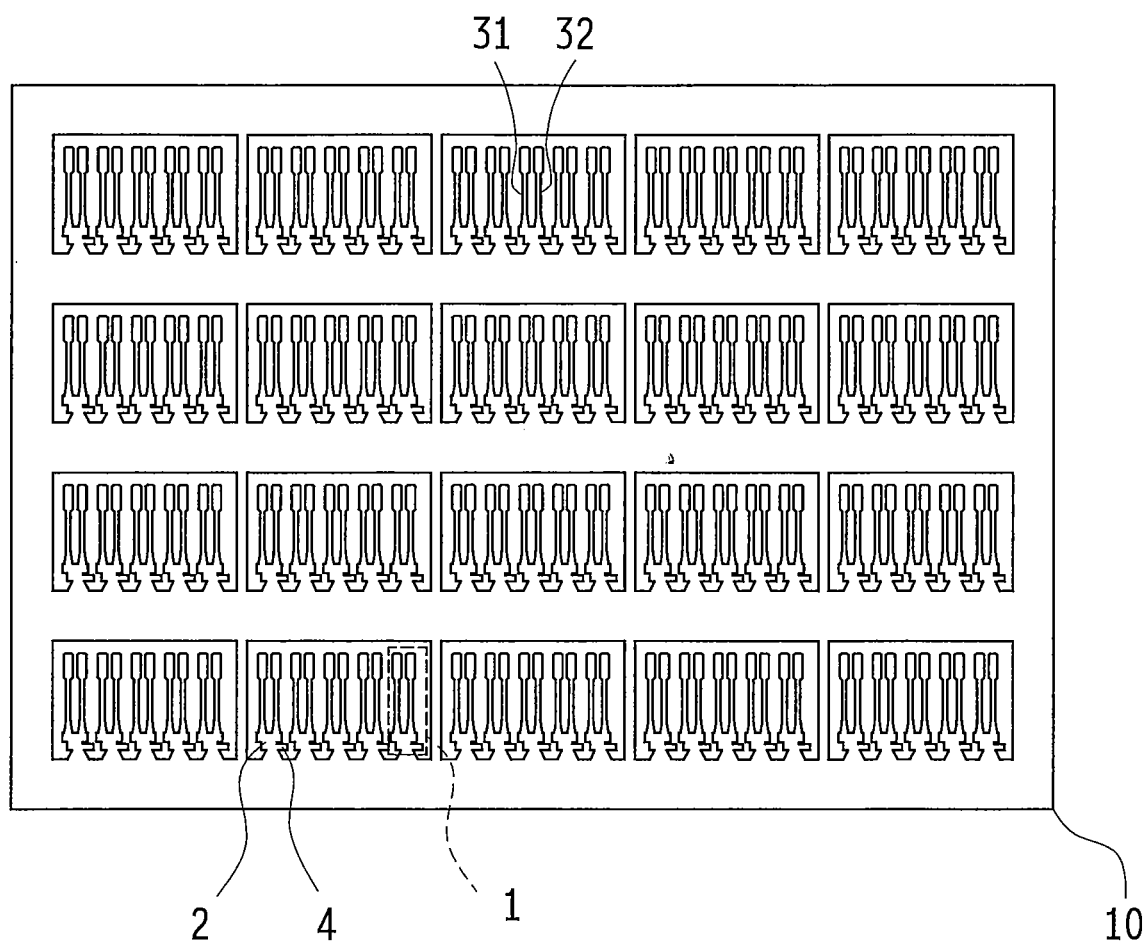
FIG. 1 is a schematic plan view of an assembly of tuning-fork crystal resonator pieces in the embodiment of the present invention.

As shown in FIG. 1, a resonator piece 1 is composed of a base 2, a pair of resonator arms 31, 32, and a projecting portion 4. Multiple resonator pieces 1 are formed simultaneously all together from a single quartz crystal wafer 10 (hereinafter simply called "wafer") having a rectangular shape in plan view. FIG. 1 only depicts the profile of the resonator pieces 1, and omits penetrating bores formed through the bases 2 of the resonator pieces 1, grooves formed in the front and back main surfaces of the resonator arms 31, 32, and electrodes formed on the resonator arms 31, 32 and the bases 2.

Figure 2:
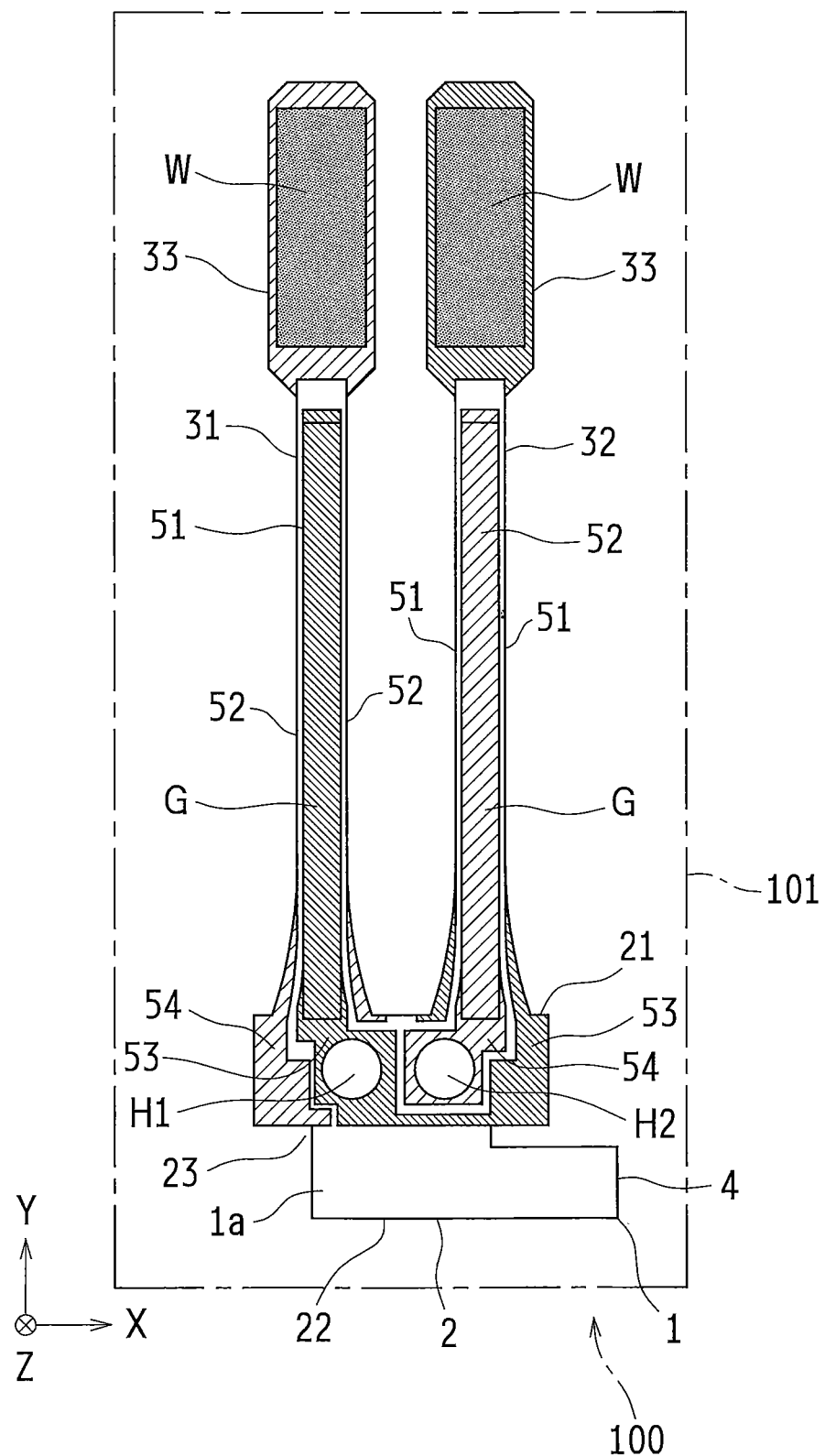
FIG. 2 is a schematic plan view showing a first main surface side of the tuning-fork crystal resonator piece in the embodiment of the present invention.
Figure 3:
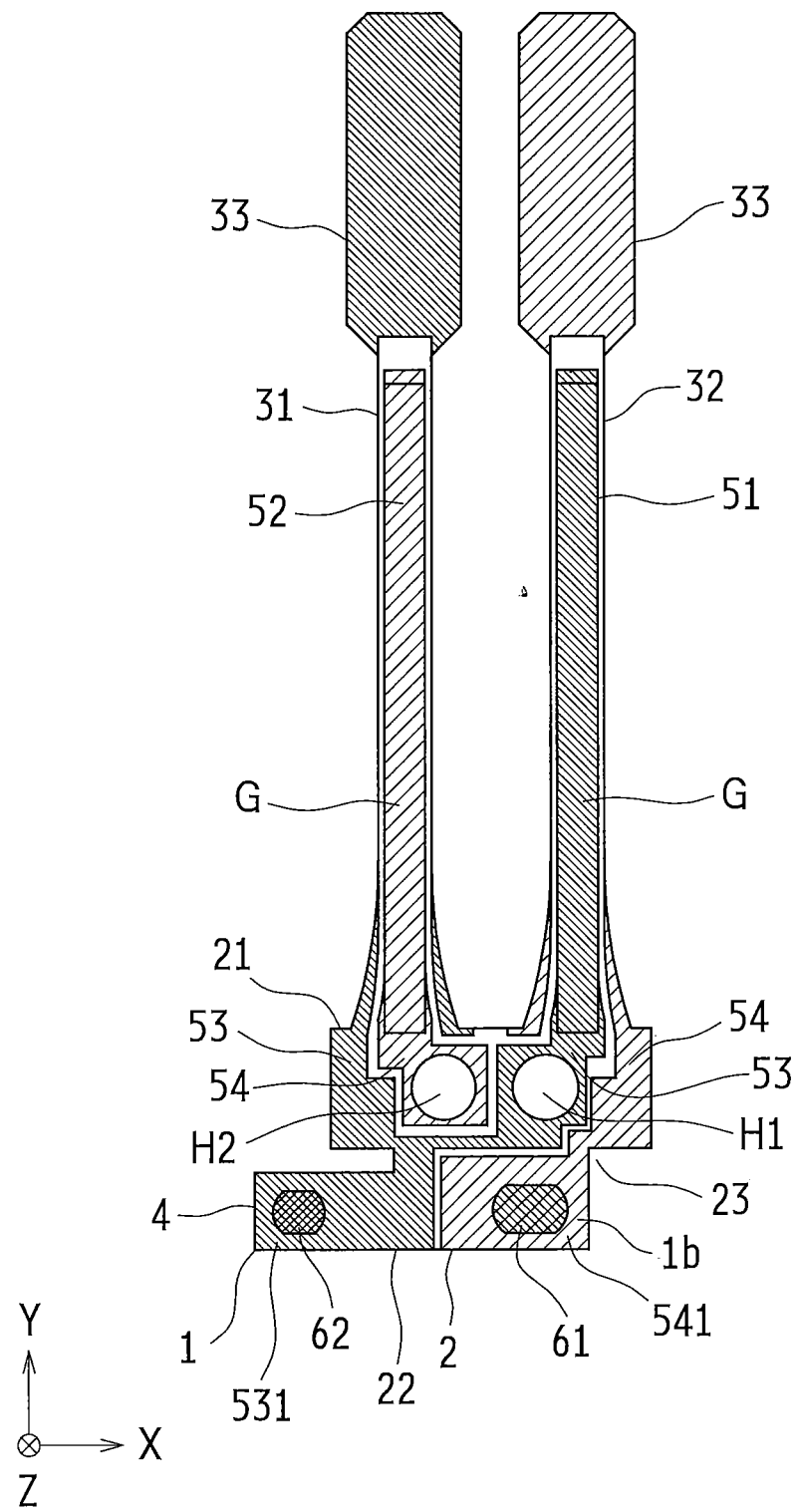
FIG. 3 is a schematic plan view showing a second main surface side of the tuning-fork crystal resonator piece in the embodiment of the present invention.

FIG. 2 is a schematic plan view showing a front surface (1*a*) side of the resonator piece 1. FIG. 3 is a schematic plan view showing a back surface (1*b*) side of the resonator piece. For convenience, two opposite main surfaces (1*a*, 1*b*) of the resonator piece 1 are designated as a front surface and a back surface, respectively. When the resonator piece 1 is mounted in the container 101, the back surface 1*b* faces electrode pads provided inside the container 101. The front surface 1*a* is the other main surface opposite to the back surface.

As shown in FIG. 2 and FIG. 3, the resonator piece 1 has a base 2, a pair of resonator arms 31, 32 extending in the same direction from a first end 21 of the base 2, and a projecting portion 4 that projects from a side surface of a second end 22 of the base 2 in a width direction of the base 2 (the axial direction X in FIG. 2 and FIG. 3).

The pair of resonator arms 31, 32 is provided with wide portions 33, 33 at their extreme ends. The width of the wide portions 33, 33 is greater than the arm width of the resonator arms 31, 32 (the dimension of the resonator arms 31, 32 orthogonal to the extending direction of the arms). The wide portions 33, 33 are integrated with the extreme ends of the resonator arms 31, 32 via widening portions (no reference signs) that get gradually wider in the extending direction of the resonator arms 31, 32. Each of the resonator arms 31, 32, the widening portions, and the wide portions 33, 33 has a pair of surfaces (no reference signs) opposed to the pair of opposite main surfaces 1*a*, 1*b*.

To achieve a greater decrease in the equivalent series resistance (Crystal Impedance; hereinafter abbreviated as "CI"), opposing long grooves G are formed in the front and back main surfaces of the pair of resonator arms 31, 32.

The base 2 includes a narrow portion 23 that makes the second end 22 of the base 2 narrower than the first end 21. The projecting portion 4 projects from a side surface of the narrow portion 23. The projecting portion 4 and the base 2, as combined, form an "L"-shaped portion that bends at a right angle in plan view. Having said that, the shape of the resonator piece 1 is not limited to the one described in this embodiment. For example, the projecting portion 4 may project not only from one side surface of the base 2 but also from another side surface of the base 2 (a side surface opposite to the one side surface), which means the projecting portions 4 project outwardly from both sides of the base 2. Further, the projecting portions 4 that project outwardly from both sides of the base 2 may bend in the extending direction of the resonator arms 31, 32 and may extend in a parallel, vertically symmetrical manner. Instead, the base 2 may have no projecting portion 4 at all.

The profile and grooves of the crystal resonator piece is formed simultaneously all altogether from a single quartz crystal wafer, by photolithography and wet etching (wet etching using an etching solution that chemically dissolves the crystal).

The resonator piece 1 is provided with first drive electrodes 51 and second drive electrodes 52 having different electrical potentials from each other, and extraction electrodes 53, 54 that are respectively led out from the first drive electrodes 51 and the second drive electrodes 52 via routing electrodes (to be described).

The first and second drive electrodes 51, 52 are formed entirely inside the long grooves G, G of the pair of resonator arms 31, 32. Irrespective of miniaturization of the resonator piece 1, the long grooves G suppress vibration leakage from the pair of resonator arms 31, 32 and ensure a favorable CI.

The first drive electrodes 51 are formed on the front and back main surfaces of the resonator arm 31, and on the inner and outer side surfaces of the resonator arm 32 via a through hole H1 (a penetrating bore with a metallic film coating on its inner wall surface). Similarly, the second drive electrodes 52 are formed on the front and back main surfaces of the resonator arm 32, and on the inner and outer side surfaces of the resonator arm 31 via a through hole H2. In this embodiment, the extraction electrodes on the front side and the back side of the base 2 are electrically connected via the through holes. Instead of forming such through holes, the extraction electrodes on the front side and the back side of the base 2 may be electrically connected via a joint area between the basal ends of the pair of resonator arms 31, 32 and the base 2.

The extraction electrodes 53, 54 are formed on the base 2 and on (only the back surface 1*b* of) the projecting portion 4. By means of the extraction electrode 53 on the base 2 and via the through hole H1, the first drive electrodes 51 on the inner and outer side surfaces of the resonator arm 32 are connected with the first drive electrodes 51 on the front and back main surfaces of the resonator arm 31. Similarly, by means of the extraction electrode 54 on the base 2 and via the through hole H2, the second drive electrodes 52 on the inner and outer side surfaces of the resonator arm 31 are connected with the second drive electrodes 52 on the front and back main surfaces of the resonator arms 32.

The extraction electrodes 53, 54 on the front surface 1*a* of the resonator piece 1 extend from the first end 21 of the base 2 to the narrow portion 23. The extraction electrodes 53, 54 on the back surface 1*b* of the resonator piece 1 extend to the second end 22 of the base 2 and the extreme end of the projecting portion 4. On the back surface 1*b* of the resonator piece 1, as shown in FIG. 3, the area around the second end 22 of the base 2 and the area around the extreme end of the projecting portion 4 serve as connection electrodes 531, 541, respectively, to be electromechanically connected to a pair of electrode pads provided inside the container 101 of the crystal resonator 100.

As shown in FIG. 3, conductive bonding materials 61, 62 are respectively provided on the top surfaces of the two connection electrodes 531, 541. In this embodiment, the bonding materials 61, 62 are plated bumps formed by electrolytic plating. The resonator piece 1 and the pair of electrode pads are conductively bonded by FCB (Flip Chip Bonding).

Each of the wide portions 33, 33 is composed of a pair of main surfaces and a pair of side surfaces. All of these surfaces are provided with routing electrodes (no reference signs). The routing electrodes are formed around the entire periphery of each wide portion 33 and around the entire periphery (a pair of main surfaces and a pair of side surfaces) of a part of each widening portion.

The first and second drive electrodes 51, 52, the extraction electrodes 53, 54, and the routing electrodes (no reference signs) mentioned above have a layer structure composed of a crystal substrate, a chromium (Cr) layer formed thereon, and a gold (Au) layer laminated on the chromium layer. The layer structure of the above electrodes is not limited to lamination of a gold layer on a chromium layer, but may be a different layer structure.

The first and second drive electrodes 51, 52, the extraction electrodes 53, 54, and the routing electrodes are formed simultaneously all together. The electrodes are initially formed on the entire main surfaces of the quartz crystal wafer by vacuum vapor deposition, sputtering or the like, and then shaped into desired shapes by photolithography and metal etching.

In the embodiment of the present invention, as shown in FIG. 2, metallic adjustment films W (frequency adjustment weights) on the wide portions 33 are formed by electrolytic plating, only on the first main surfaces (on the front surface 1a) of the wide portions 33. To adjust the frequency of the resonator piece 1, the mass of the metallic adjustment films W is reduced by irradiation of a beam such as a laser beam or an ion beam. In this embodiment, the metallic adjustment films W are formed only on the first main surfaces of the wide portions 33. Instead, the metallic adjustment films W may be formed on both main surfaces of the wide portions 33, namely, on the first main surfaces and the second main surfaces opposite to the first main surfaces.

In this embodiment, the metallic adjustment films W have a slightly smaller plane area than the routing electrodes on the main surfaces of the wide portions 33, 33. The plane area of the metallic adjustment films W may be substantially equal to that of the routing electrodes on the main surfaces of the wide portions 33, 33. The metallic adjustment films W on the microminiaturized resonator piece 1 in this embodiment are thicker (at least 0.003 mm thick) than the metallic adjustment films W on a larger resonator piece 1. Specifically, the metallic adjustment films W in this embodiment has a thickness of 0.005 mm. The thick metallic adjustment films W in this embodiment are formed by electrolytic plating, but may be formed by sputtering or vapor deposition.

After the drive electrodes and other various electrodes are added to multiple resonator pieces 1, 1 . . . 1 in the wafer 10, the oscillation frequency of these resonator pieces 1 gets lower than the frequency before the addition of those electrodes. The frequency gets even lower after the metallic adjustment films W are formed on the first main surfaces of the wide portions 33. Unlike the conventional examples, the embodiment of the present invention does not clearly divide each metallic adjustment film W into the rough adjustment area and the fine adjustment area before the frequency adjustment step.

The frequency adjustment step for the resonator piece 1 according to the embodiment of the present invention is described below.

Rough Adjustment Step

Figure 4:
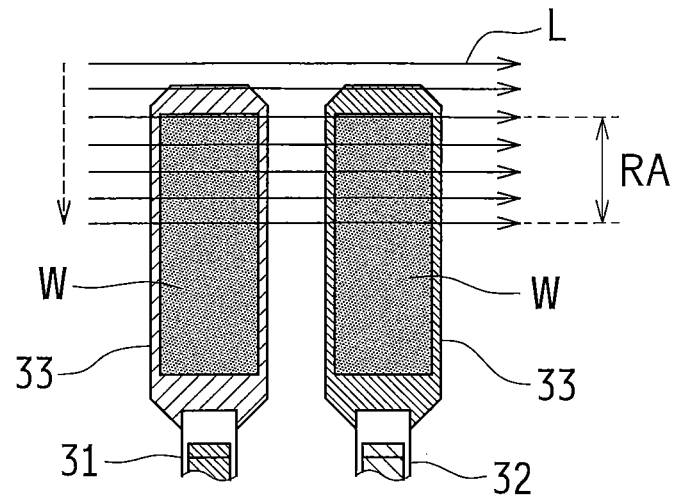
FIG. 4 is a partial enlarged view of the tuning-fork crystal resonator piece, before the rough adjustment step in the embodiment of the present invention.

In the rough adjustment step, the frequency is roughly adjusted by partial thinning or removal of the metallic adjustment films W. As shown in FIG. 4, the rough adjustment step of this embodiment starts irradiation of a laser beam L at the outside of the wide portions 33 beyond their extreme ends (upper than the wide portions 33 in FIG. 4). Specifically, the start point of the laser beam L is outside the wide portions 33, apart from their extreme ends in the extending direction of the resonator arms 31, 32. While the laser beam L is emitted in an arm-width direction of the resonator arms (the right arrows in FIG. 4), the irradiation positions are shifting at a predetermined pitch toward the basal ends of the resonator arms 31, 32 (the down arrow in FIG. 4). The metallic adjustment films W are thinned or removed by the shifting irradiation of the laser beam L. In FIG. 4, the roughly adjusted areas are indicated as "RA". In this context, the term "remove", "removal" or a derivative thereof means that the mass of the metallic adjustment films W in the thickness direction of the metallic adjustment films W is reduced until the electrodes or the crystal base is/are exposed. The term "thin", "thinning" or a derivative thereof means that the mass of the metallic adjustment films W is reduced in the thickness direction of the metallic adjustment films W such that the metallic adjustment films W remain partially, without exposing the electrodes or the crystal base.

By starting the irradiation of a laser beam L at the outside of the wide portions 33 beyond their extreme ends, the laser beam L can hit edges of the metallic adjustment films W on the extreme end side of the resonator arms 31, 32 more reliably. This process enables efficient rough adjustment.

In the rough adjustment step in this embodiment, the irradiation of the laser beam L starts at the outside of the wide portions 33 beyond their extreme ends, but may start at a different position instead. For example, the irradiation of a laser beam L may start at the extreme ends of the resonator arms 31, 32 or the edges of the metallic adjustment films W on the extreme end side of the resonator arms 31, 32.

The laser used in this embodiment is a green laser (wavelength 532 nm). A green laser is suitable for ultrafine processing due to its high absorptance for an electrode material used in this embodiment (gold) and its capability to narrow the beam diameter. Besides, a green laser is suitable for laser trimming of the electrodes formed on the resonator piece 1 because the beam passes through a transparent medium such as a crystal.

Figure 5:
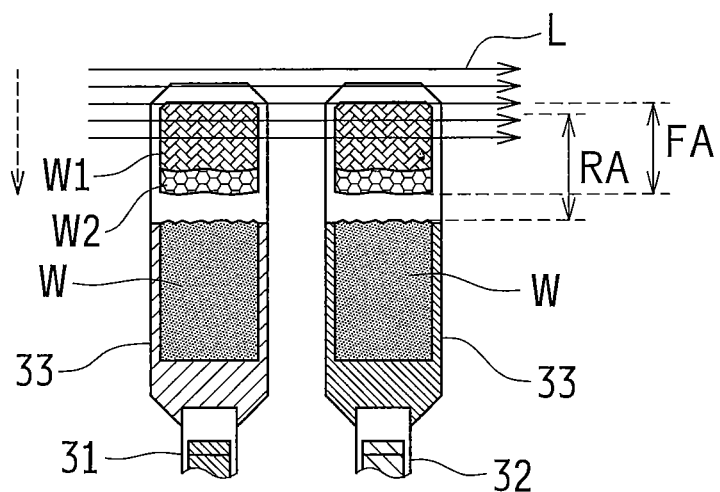
FIG. 5 is a partial enlarged view of the tuning-fork crystal resonator piece, after the rough adjustment step in the embodiment of the present invention.

FIG. 5 shows the state after the rough adjustment step. In the laser trimmed areas after the rough adjustment step, the metallic adjustment films W have melted and sublimed by heat of the laser beam L. The molten and sublimed metal particles are deposited to form products W1, W2 derived from the metallic adjustment films W (hereinafter simply called "products"). After the rough adjustment step, the products W1, W2 partially spread beyond the areas of the original metallic adjustment films W. Specifically, the products W1, W2 spread beyond the areas of the original metallic adjustment films W, toward the extreme ends of the resonator arms 31, 32.

The products W2 are thinner than the products W1. The thick products W1 are formed on the extreme end side of the resonator arms 31, 32, and the thin products W2 are formed on the basal end side of the resonator arms 31, 32 relative to the products W1. This is because the laser trimming starts on the extreme end side of the resonator arms 31, 32 by emitting the laser beam L in the arm-width direction of the resonator arms 31, 32, and continues the irradiation with shifting the irradiation positions toward the basal ends of the resonator arms 31, 32. In this embodiment, the products derived from the metallic adjustment films W are clearly distinguished as areas W1, W2. However, this is merely an example, and the products W1, W2 may not be clearly distinguishable between a thick area and a thin area. In FIG. 5, the white areas within the metallic adjustment films W represent the areas where the crystal bases are exposed by laser trimming.

The frequency adjustment method according to the present invention can efficiently accomplish the fine frequency adjustment. Since the irradiation of the laser beam L to the metallic adjustment films W starts on the extreme end side of the resonator arms 31, 32, this method can increase the amount of products W1, W2 that attach to the extreme end side of the resonator arms 31, 32 where the reduction of the mass causes a greater change in frequency. Namely, in the product attached area of the products W1, W2, the area closer to the extreme ends of the resonator arms 31, 32 are more effective for efficient fine adjustment. This process is suitable particularly when the fine adjustment step needs a great amount of adjustment in order to bring the frequency to the target frequency range.

Fine Adjustment Step

In the fine adjustment step, the frequency is finely adjusted by at least partial thinning or removal of the products W1, W2 formed in the rough adjustment step. As shown in FIG. 5, the fine adjustment step of this embodiment starts irradiation of a laser beam L at a position that is apart from the edges of the products W1 on the extreme end side of the resonator arms 31, 32 and that is displaced in the extending direction of the resonator arms 31, 32. While the laser beam L is emitted in the arm-width direction of the resonator arms 31, 32 (the right arrows in FIG. 5), the irradiation positions are shifting at a predetermined pitch toward the basal ends of the resonator arms 31, 32 (the down arrow in FIG. 5). The products W1 are at least partially thinned or removed by the shifting irradiation of the laser beam L. In this context, the term "remove", "removal" or a derivative thereof means that the mass of the products W1, W2 is reduced in the thickness direction of the products W1, W2 until the electrodes or the crystal base is/are exposed. The term "thin", "thinning" or a derivative thereof means that the mass of the products W1, W2 is reduced in the thickness direction of the products W1, W2 such that the products W1, W2 remain partially, without exposing the electrodes or the crystal base.

By starting the irradiation of a laser beam L at the position apart from the edges of the products W1 on the extreme end side of the resonator arms 31, 32, beyond the extreme ends of the resonator arms 31, 32, the laser beam L can hit the edges of the products W1 on the extreme end side of the resonator arms 31, 32 more reliably.

Figure 6:
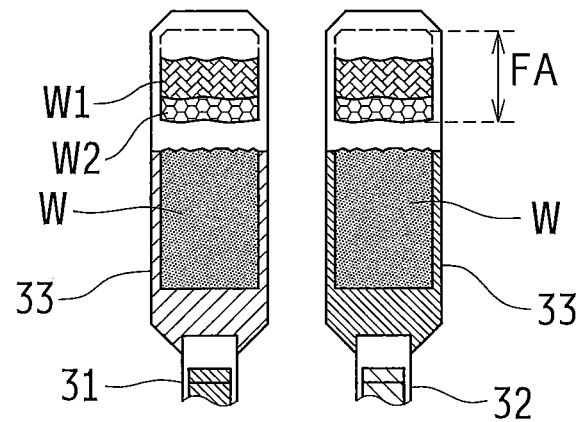
FIG. 6 is a partial enlarged view of the tuning-fork crystal resonator piece, after the fine adjustment step in the embodiment of the present invention.

As shown in FIG. 5, the fine adjustment in this embodiment is performed only within the product attached areas (FA) of the products W1, W2 derived from the metallic adjustment films W during the rough adjustment step. The remaining areas of the metallic adjustment films W that have not been thinned or removed in the rough adjustment step for the metallic adjustment films W are not irradiated with the laser beam L. Specifically, the target areas in the fine adjustment, "FA" in FIG. 5, are limited to the areas where the products W1, W2 are attached (the attached areas of the products W1, W2, ranging from positions closest to the distant ends in the extending direction of the resonator arms 31, 32, to positions closest to the basal ends of the resonator arms 31, 32). FIG. 6 shows the state after the fine adjustment step, wherein the products W1 are partially removed (on the extreme end side of the resonator arms 31, 32) after the fine adjustment step.

The fine adjustment step can efficiently accomplish the fine frequency adjustment because the fine adjustment in the areas of products (W1, W2) derived from the metallic adjustment films W starts at the positions where the maximum amount of adjustment is expected (on the distant arm-end side of W1). Namely, in the product attached areas (W1, W2), the edges of the products on the extreme end side of the resonator arms 31, 32 (the distant arm-end edges of W1), which are most sensitive to frequency adjustment, are thinned or removed without fail. This process is suitable particularly when the fine adjustment step needs a relatively large amount of adjustment in order to bring the frequency to the target frequency range.

In the fine adjustment step, the thinning or removal of the products W1, W2 may start at positions apart from the edges of the products W1, W2 derived from the metallic adjustment films W on the extreme end side of the resonator arms 31, 32, and continues with shifting the irradiation positions toward the basal ends of the resonator arms 31, 32. This process can efficiently accomplish the fine frequency adjustment. In the product attached areas of the products W1, W2, the thinning or removal of the products W1, W2 starts at the positions apart from the edges of the product attached areas on the extreme end side of the resonator arms 31, 32 (certain positions within the products W1, W2), such positions being relatively less sensitive to frequency adjustment than the product attached areas on the extreme end side of the resonator arms 31, 32. This process enables efficient frequency adjustment in the case where the fine adjustment step needs a relatively small amount of adjustment in order to bring the frequency to the target frequency range.

The fine adjustment step as described above enables the frequency adjustment without deterioration of its accuracy, because portions of the metallic adjustment films W not processed in the rough adjustment step are not irradiated with the laser beam L in the fine adjustment step, either. In contrast, if remaining thick portions of the metallic adjustment films W (portions not processed in the rough adjustment step) are irradiated with the laser beam L, the influence of thickness is dominant over the sensitivity to frequency adjustment, and deteriorates the accuracy of frequency adjustment. The fine adjustment step in the above-described embodiment can prevent this problem.

In the microminiaturized tuning-fork crystal resonator, the embodiment of the present invention can improve the accuracy of frequency adjustment of the resonator piece 1 having thick metallic adjustment films W. In the case where a microminiaturized tuning-fork crystal resonator has the metallic adjustment films W in a thickness of 0.003 mm or less, the products W1, W2 are formed in a smaller amount than in the case where the metallic adjustment films W have a thickness of 0.003 mm or more. This arrangement prevents the attached products W1, W2 from falling off from the resonator piece 1 in a washing step and causing a serious change in frequency. However, the metallic adjustment films W having a thickness of 0.003 mm or less may not be able to leave a sufficient amount of products to be processed in the fine adjustment after the rough adjustment step. To compensate for the insufficiency, it is necessary to irradiate the remaining thick portions of the metallic adjustment films W with the laser beam L.

On the other hand, the metallic adjustment films W having a thickness of 0.003 mm or more can form the products W1, W2 in a sufficient amount to be processed in the fine adjustment, and can ensure the amount of fine adjustment. Besides, the fine adjustment using the products W1, W2 can dispense with irradiation of the laser beam L to the thick portions of the metallic adjustment films W that have not been processed in the rough adjustment step. This process can prevent deterioration of the accuracy of frequency adjustment. Considering the beam diameter of the laser beam L, the maximum thickness of the metallic adjustment films W is 0.020 mm, and is more preferably 0.015 mm. Hence, the thickness of the metallic adjustment films W is preferably from 0.003 mm to 0.020 mm, and is more preferably from 0.003 mm to 0.015 mm. In the case where the metallic adjustment films W are provided on both the first and second main surfaces of the wide portions 33, a preferable thickness is 0.003 mm or more as the total thickness of the metallic adjustment films W formed on the first main surfaces of the wide portions 33 and those formed on the second main surfaces of the wide portions 33.

As described above, the preferable thickness of the metallic adjustment films W is 0.003 mm or more, for the crystal resonator 100 whose plane external dimensions are 1.6 mm or less on long sides and 1.0 mm or less on short sides (hereinafter called "1.6 mm×1.0 mm crystal resonator"). For a smaller crystal resonator 100, a preferable thickness of the metallic adjustment films W is set as follows. If the plane external dimensions of the crystal resonator 100 are 1.2 mm or less on long sides and 1.0 mm or less on short sides (hereinafter called "1.2 mm×1.0 mm crystal resonator"), the thickness of the metallic adjustment films W is preferably 0.010 mm or more.

With this setting, the 1.2 mm×1.0 mm crystal resonator 100 as well as the 1.6 mm×1.0 mm crystal resonator 100 can improve the accuracy of frequency adjustment of the resonator piece 1 having the metallic adjustment films W. In the case where the 1.2 mm×1.0 mm crystal resonator 100 has the metallic adjustment films W in a thickness of 0.010 mm or less, the products W1, W2 are formed in a smaller amount than in the case where the metallic adjustment films W have a thickness of 0.010 mm or more. This arrangement prevents the attached products W1, W2 from falling off from the resonator piece 1 in a washing step and causing a serious change in frequency. However, the metallic adjustment films W having a thickness of 0.010 mm or less may not be able to leave a sufficient amount of products to be processed in the fine adjustment after the rough adjustment step. To compensate for the insufficiency, it is necessary to irradiate the remaining thick portions of the metallic adjustment films W with the laser beam L.

On the other hand, in the 1.2 mm×1.0 mm crystal resonator 100, the metallic adjustment films W having a thickness of 0.010 mm or more can form the products W1, W2 in a sufficient amount to be processed in the fine adjustment, and can ensure the amount of fine adjustment. Besides, the fine adjustment using the products W1, W2 can dispense with irradiation of the laser beam L to the thick portions of the metallic adjustment films W that have not been processed in the rough adjustment step. This process can prevent deterioration of the accuracy of frequency adjustment. Considering the beam diameter of the laser beam L, the maximum thickness of the metallic adjustment films W is 0.020 mm, and is more preferably 0.015 mm. Hence, the thickness of the metallic adjustment films W is preferably from 0.010 mm to 0.020 mm, and is more preferably from 0.010 mm to 0.015 mm. Similar to the 1.6 mm×1.0 mm crystal resonator 100, in the case where the metallic adjustment films W are provided on both the first and second main surfaces of the wide portions 33, a preferable thickness is 0.010 mm or more as the total thickness of the metallic adjustment films W formed on the first main surfaces of the wide portions 33 and those formed on the second main surfaces of the wide portions 33.

Figure 7:
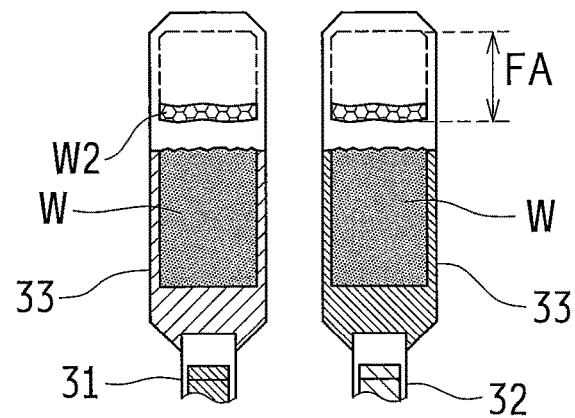
FIG. 7 is a partial enlarged view of the tuning-fork crystal resonator piece, after the fine adjustment step in a modified example of the embodiment of the present invention.
Figure 8:
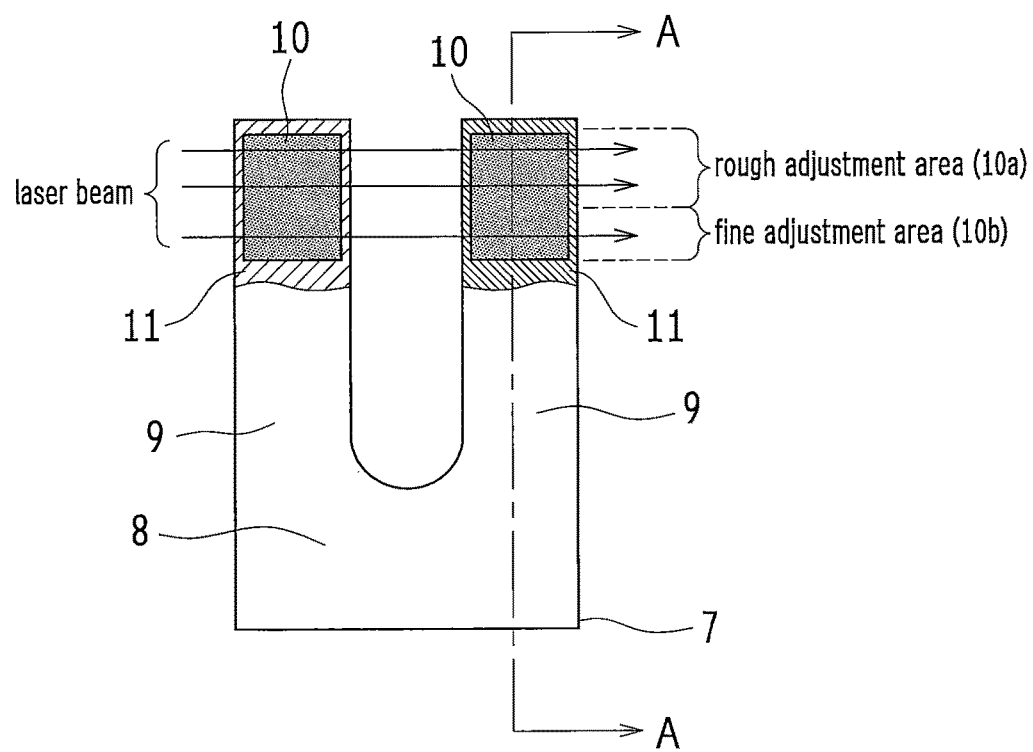
FIG. 8 is a schematic plan view of a tuning-fork crystal resonator piece, representing the conventional frequency adjustment for the tuning-fork crystal resonator piece.
Figure 9:
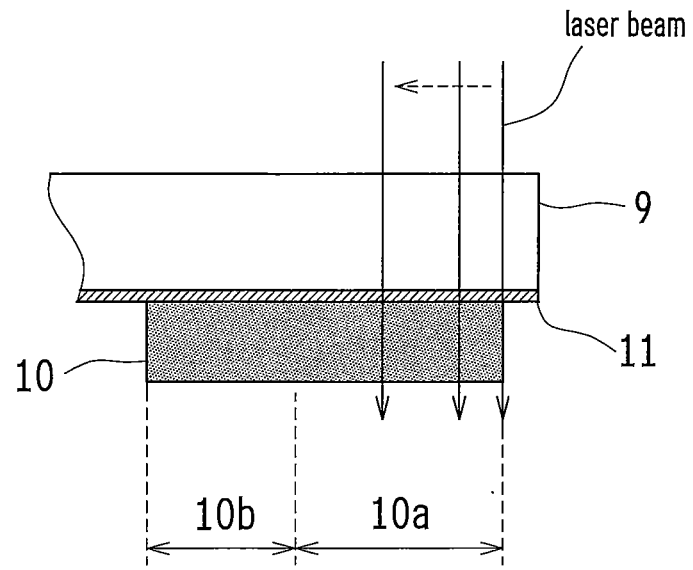
FIG. 9 is a schematic cross section taken along the line A-A in FIG. 8.
Figure 10:
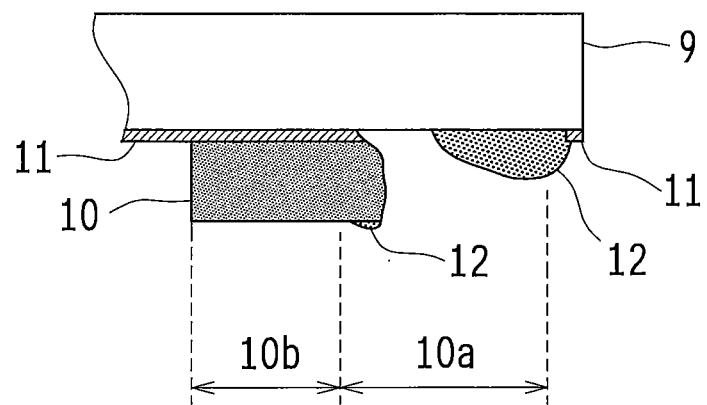
FIG. 10 is a schematic cross section of a tuning-fork crystal resonator piece, after the conventional rough adjustment step.

In the fine adjustment step according to the embodiment of the present invention, the irradiation target of the laser beam L is only the product W1, rather than both the products W1, W2 derived from the metallic adjustment films W. Instead, in a modified example according to the embodiment of the present invention as shown in FIG. 7, the irradiation target of the laser beam L may be both the products W1 and the products W2, and the entire area of the products W1 and a part of the products W2 (in the example of FIG. 7, areas closer to the extreme ends of the resonator arms) may be thinned or removed.

The present invention can be embodied and practiced in other different forms without departing from the spirit and essential characteristics of the present invention. Therefore, the above-described embodiment is considered in all respects as illustrative and not restrictive. The scope of the invention is indicated by the appended claims rather than by the foregoing description. All variations and modifications falling within the equivalency range of the appended claims are intended to be embraced therein.

As an example of piezoelectric resonator devices, the above-described embodiment refers to a tuning-fork crystal resonator. In addition, the present invention is also applicable to other piezoelectric resonator devices (e.g., a tuning-fork crystal oscillator).

This application claims priority to Japanese Patent Application No. 2016-213552, filed Oct. 31, 2016. The contents of this application are incorporated herein by reference in its entirety.

INDUSTRIAL APPLICABILITY

The present invention is applicable to mass production of piezoelectric resonator devices.

REFERENCE SIGNS LIST 1 tuning-fork crystal resonator piece
2 base
31, 32 resonator arm
W metallic adjustment film
W1, W2 product deriving from the metallic adjustment film

The invention claimed is:

1. A frequency adjustment method for a piezoelectric resonator device, wherein the piezoelectric resonator device comprises a tuning-fork piezoelectric resonator piece having a pair of resonator arms and a metallic adjustment film formed on each of the resonator arms, and wherein a frequency is adjusted by reduction of a mass of the metallic adjustment film, the frequency adjustment method comprising:
a rough adjustment of roughly adjusting the frequency by partially thinning or removing the metallic adjustment film; and
a fine adjustment of finely adjusting the frequency by at least partially thinning or removing a product derived from the metallic adjustment film that has been thinned or removed in the rough adjustment,
wherein the piezoelectric resonator device that accommodates the tuning-fork piezoelectric resonator piece has a generally rectangular shape in plan view, with plane external dimensions of the piezoelectric resonator device being 1.6 mm or less on long sides and 1.0 mm or less on short sides, and
wherein the metallic adjustment film has a thickness in a range from 0.003 mm to 0.020 mm before the rough adjustment.

2. The frequency adjustment method for a piezoelectric resonator device according to claim 1,
wherein, in the fine adjustment, the thinning or removal of the product derived from the metallic adjustment film starts at an edge of the product on an extreme end side of each resonator arm, and the thinning or removal of the product proceeds toward a basal end of each resonator arm.

3. The frequency adjustment method for a piezoelectric resonator device according to claim 1,
wherein, in the fine adjustment, the thinning or removal of the product derived from the metallic adjustment film starts at a position that is apart from an edge of the product on an extreme end side of each resonator arm and that is displaced toward a basal end of each resonator arm, and the thinning or removal of the product proceeds toward the basal end of each resonator arm.

4. The frequency adjustment method for a piezoelectric resonator device according to claim 1,
wherein the fine adjustment is not applied to a remaining area that has not been thinned or removed in the rough adjustment for the metallic adjustment film.

5. A frequency adjustment method for a piezoelectric resonator device, wherein the piezoelectric resonator device comprises a tuning-fork piezoelectric resonator piece having a pair of resonator arms and a metallic adjustment film formed on each of the resonator arms, and wherein a frequency is adjusted by reduction of a mass of the metallic adjustment film,
the frequency adjustment method comprising:
a rough adjustment of roughly adjusting the frequency by partially thinning or removing the metallic adjustment film; and
a fine adjustment of finely adjusting the frequency by at least partially thinning or removing a product derived from the metallic adjustment film that has been thinned or removed in the rough adjustment,
wherein the piezoelectric resonator device that accommodates the tuning-fork piezoelectric resonator piece has a generally rectangular shape in plan view, with plane external dimensions of the piezoelectric resonator device being 1.2 mm or less on long sides and 1.0 mm or less on short sides, and
wherein the metallic adjustment film has a thickness in a range from 0.010 mm to 0.020 mm before the rough adjustment.

6. The frequency adjustment method for a piezoelectric resonator device according to claim 5,
wherein, in the fine adjustment, the thinning or removal of the product derived from the metallic adjustment film starts at an edge of the product on an extreme end side of each resonator arm, and the thinning or removal of the product proceeds toward a basal end of each resonator arm.

7. The frequency adjustment method for a piezoelectric resonator device according to claim 5,
wherein, in the fine adjustment, the thinning or removal of the product derived from the metallic adjustment film starts at a position that is apart from an edge of the product on an extreme end side of each resonator arm and that is displaced toward a basal end of each resonator arm, and the thinning or removal of the product proceeds toward the basal end of each resonator arm.

8. The frequency adjustment method for a piezoelectric resonator device according to claim 5,
wherein the fine adjustment is not applied to a remaining area that has not been thinned or removed in the rough adjustment for the metallic adjustment film.

* * * * *